United States Patent
Letemplier

(10) Patent No.: US 8,149,908 B2
(45) Date of Patent: Apr. 3, 2012

(54) METHOD AND DEVICE FOR CONTROLLING PEAK POWER AND PULSE WIDTH OF A BROADBAND GAUSSIAN PULSE HIGH-POWER RF TRANSMITTER

(75) Inventor: Alain Letemplier, Mayenne (FR)

(73) Assignee: Thales (FR)

( * ) Notice: Subject to any disclaimer, the term of this patent is extended or adjusted under 35 U.S.C. 154(b) by 827 days.

(21) Appl. No.: 12/065,376

(22) PCT Filed: Aug. 30, 2006

(86) PCT No.: PCT/EP2006/065835
§ 371 (c)(1),
(2), (4) Date: Jul. 29, 2008

(87) PCT Pub. No.: WO2007/025993
PCT Pub. Date: Mar. 8, 2007

(65) Prior Publication Data
US 2009/0028251 A1    Jan. 29, 2009

(30) Foreign Application Priority Data
Aug. 30, 2005 (FR) ................................. 05 08875

(51) Int. Cl.
*H03K 7/08* (2006.01)

(52) U.S. Cl. ........ 375/238; 375/328; 375/320; 375/297; 375/351

(58) Field of Classification Search .................. 375/328, 375/320, 297, 351
See application file for complete search history.

(56) References Cited

U.S. PATENT DOCUMENTS

| | | | |
|---|---|---|---|
| 3,612,769 A * | 10/1971 | Oman | 370/301 |
| 3,668,533 A | 6/1972 | Fish et al. | |
| 4,409,594 A | 10/1983 | Graziani | |
| 4,412,337 A | 10/1983 | Bickley et al. | |
| 5,049,832 A | 9/1991 | Cavers | |
| 5,420,536 A | 5/1995 | Faulkner et al. | |
| 6,141,390 A | 10/2000 | Cova | |
| 6,246,286 B1 * | 6/2001 | Persson | 330/149 |
| 6,396,345 B2 | 5/2002 | Dolman | |
| 2003/0184374 A1 | 10/2003 | Huang et al. | |
| 2004/0213351 A1 * | 10/2004 | Shattil | 375/260 |

FOREIGN PATENT DOCUMENTS

| | | |
|---|---|---|
| EP | 0 685 932 | 12/1995 |
| EP | 1017162 A2 | 7/2000 |

* cited by examiner

*Primary Examiner* — Kabir A Timory
(74) *Attorney, Agent, or Firm* — Lowe Hauptman Ham & Berner, LLP

(57) ABSTRACT

A device for generating a modulation signal for an RF pulse transmitter is disclosed. The device includes a detector, a video amplifier, an analog processing device, and a modulation signal generating device. The modulation signal generating device is configured to receive an information cue from the analog processing device and to output the modulation signal. The modulation signal generating device includes a digital processing device and a signal generating device. The digital processing device is configured to receive a transmission synchro signal and the information cue and to generate a first control signal and a second control signal. The signal generating device is configured to generate a variable-amplitude Gaussian-shaped signal in response to the first control signal, to generate a variable-amplitude square-shaped signal in response to the second control signal, and to generate the modulation signal according to the Gaussian-shaped signal and the square-shaped signal.

6 Claims, 3 Drawing Sheets

METHOD AND DEVICE FOR CONTROLLING PEAK POWER AND PULSE WIDTH OF A BROADBAND GAUSSIAN PULSE HIGH-POWER RF TRANSMITTER

CROSS-REFERENCE TO RELATED APPLICATIONS

The present Application is based on International Application No. PCT/EP2006/065835, filed on Aug. 30, 2006, which in turn corresponds to French Application No. 05 08875 filed on Aug. 30, 2005, and priority is hereby claimed under 35 USC §119 based on these applications. Each of these applications are hereby incorporated by reference in their entirety into the present application.

FIELD OF THE INVENTION

The invention relates to a method and a device for controlling notably the amplitude and power parameters of a pulse transmitted by a high-power transmitter. It applies, notably, to controlling the peak power and the pulse width of a broadband Gaussian pulse high-power RF transmitter. The invention applies for example in the case of RF pulse transmitters whatever the type of pulses.

BACKGROUND OF THE INVENTION

Methods and devices making it possible to control the peak power and the pulse width of a high-power transmitter are known from the prior art.

The use of bipolar transistors is still today inescapable for obtaining peak power levels of greater than 500 W in a reasonable volume.

A commonly used solution consists notably in controlling the base emitter bias current of n successive common-base class C stages, such as described in the applicant's patent EP 06685932.

One of the drawbacks of this solution is that the control elements are placed in series in the power supply of class C bipolar transistors, thus giving rise to losses that decrease the efficiency of the transmitter. Moreover, these types of transmission chain require the employment of significant cooling means as soon as the load rate exceeds 1%, thereby limiting its employment for airborne applications exceeding 500 W peak, for example.

SUMMARY OF THE INVENTION

The integrity of the shape of the RF pulse is hard to control in a broad frequency band and a broad variation in operating temperature.

The invention relates to a device for controlling the parameters of a pulse of a high-power RF pulse transmitter comprising at least one amplifier characterized in that it comprises at least the following elements: a detector of the transmitted pulse, a video amplifier, an analog processing device suitable for providing information relating to the width and power parameters of the transmitted pulse, a digital processing device receiving the information cues relating to the parameters of the transmitted pulse and suitable for generating the control signals for a device suitable for generating a variable-amplitude substantially Gaussian-shaped signal synchronized with the synchro transmission and for generating the control signals of a device suitable for generating a variable-amplitude substantially square-shaped signal synchronized with the synchro transmission.

The invention has notably the following advantages:
the low-voltage modulation signals are easy to generate digitally with a digital-to-analog Converter (DAC) and simple operational amplifiers,
the use of LDMOS transistors limits the number of amplifier stages and improves the efficiency of the transmission chain and, consequently, gives access to more significant load rates without excessive heating. For example, the efficiency of the transmitter can be improved from 20 to 30%,
the invention guarantees the integrity of the Gaussian pulse transmitted (shape, width, etc.),
it allows regulation of the peak power throughout the frequency band,
it makes it possible to obtain stable temperature performance.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWING

The present invention is illustrated by way of example, and not by limitation, in the figures of the accompanying drawings, wherein elements having the same reference numeral designations represent like elements throughout and wherein.

DETAILED DESCRIPTION OF THE DRAWING

The method and the device according to the invention rely notably on the following principle: by virtue of a detection of the signal transmitted on the one hand and the use of a variable-gain RF amp on the other hand, a pulse signal of Gaussian shape is generated with a pre-biasing pedestal (the function of which pedestal is notably to bias the amplifier) of amplitude controlled by a digitized feedback system intended for the class C power terminal stages. The modulation signal is constituted by the addition of a Gaussian-shaped component of variable amplitude making it possible to control the peak power and of a square component of variable amplitude making it possible to generate a prebias of the terminal stage or stages, in this example, of the class amplifiers C, so as to obtain a pulse of Gaussian shape that is fully or at least mainly complied with and of controlled width.

Figure 1:
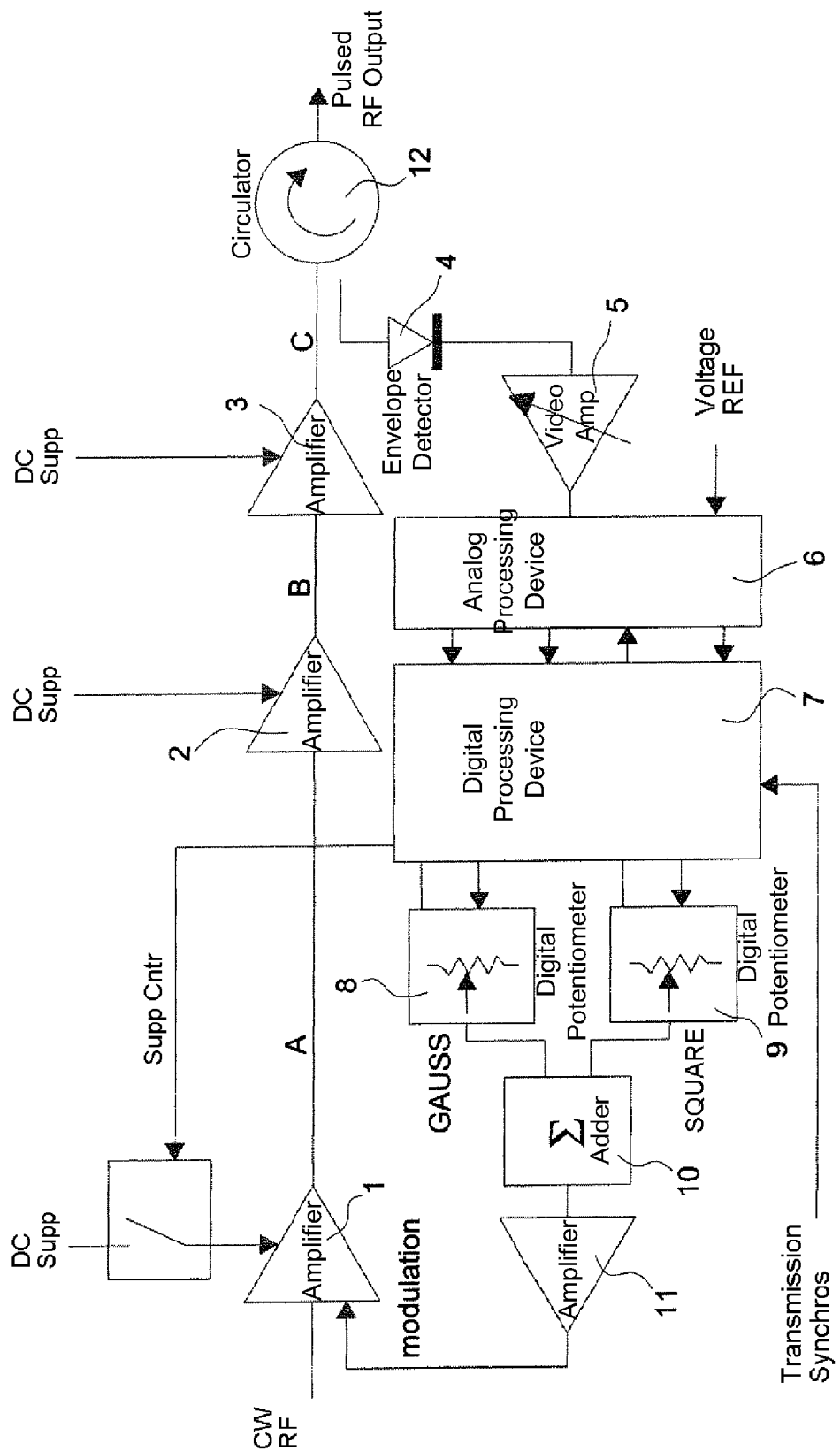
FIG. 1 a schematic of the invention,
FIGS. 2A and 2B a series of timecharts for the control and drive signals and the modulation signals generated by the invention,
FIG. 3 an exemplary architecture for an amplifier powered by pulsed voltage.

FIG. 1 represents a schematic of an exemplary system according to the invention. The system comprises notably a first amplifier 1 operating for example in class AB. The amplifier is, for example, powered by pulsed voltage. A second amplifier 2 disposed following the first operates in class C and is DC-powered, a third amplifier 3 operates in class C and is DC-powered. An envelope detector 4 is disposed at the end of the amplifying chain and its function is notably to detect the envelope of the signal transmitted by the chain. The detector is for example temperature-compensated. The detector detects notably the pulses transmitted from which an amplitude information cue and a width information are extracted.

The detected envelope is sent to a video amp 5 whose output is linked to an analog processing device 6 which receives a voltage value REF. The analog processing device 6 is coupled to a digital processing device 7 which receives the transmission signals.

The digital processing device 7 generates control signals and sends them respectively to a digital potentiometer 8 so as to generate a Gaussian-shaped signal and to a digital potentiometer 9 so as to generate a square-shaped signal. The two signals are thereafter summed in an adder 10. The signal formed by the sum of the two signals is thereafter sent to an amplifier 11 before being dispatched to the first amplifier 1.

In a more detailed manner:
the analog processing device 6 provides notably:
  an information cue VMAX if the peak amplitude of the detected transmission is greater than the max threshold (K1×voltage REF),
  an information cue VMIN if the peak amplitude of the detected transmission is less than the min threshold (K2×voltage REF),
  a pulse of width representative of the transmitted pulse detected taken at 5 or 10% of the max amplitude (easier discrimination for a signal of Gaussian type); the digital processing device 7 provides notably:
  the control signal for the pulsed power supply of the class AB modulator stage synchronized to the transmission,
  the control signals for a digital-to-analog (DAC) and for a digital potentiometer making it possible to generate a variable-amplitude Gaussian-shaped signal synchronized with the synchro transmission
  the control signals for an analog switch and for a digital potentiometer making it possible to generate a variable-amplitude square-shaped signal synchronized with the synchro transmission,
  the controls for the digital potentiometers are of the "up/down" type, a single increment or decrement is dispatched to each synchro transmission as a function of the information cues received from the analog processing, Amplitude too high or too low, width too high or too low.

The choice of the peak power at output is made for example by adjusting the gain of the video ampli.

The temperature stability of the system depends only on the stability of the detector and the video ampli, the other variations are automatically compensated by the feedback.

The frequency stability of the system depends only on the frequency sensitivity of the coupler and the detector, the other variations are automatically compensated by the feedback.

The addition of a circulator 12 at the output of the stage makes it possible notably to increase the immunity of the system to the adaptation conditions at the output if the directivity of the coupler is insufficient.

The precision of the peak power depends only on the frequency sensitivity and temperature sensitivity of the assembly consisting of coupler, detector, video amp and the circulator.

Figure 2A:
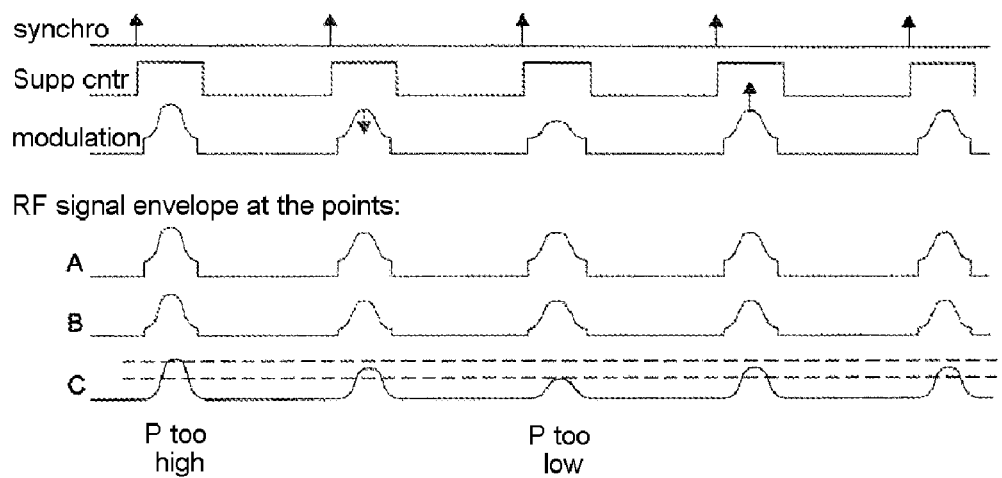
Figure 2B:
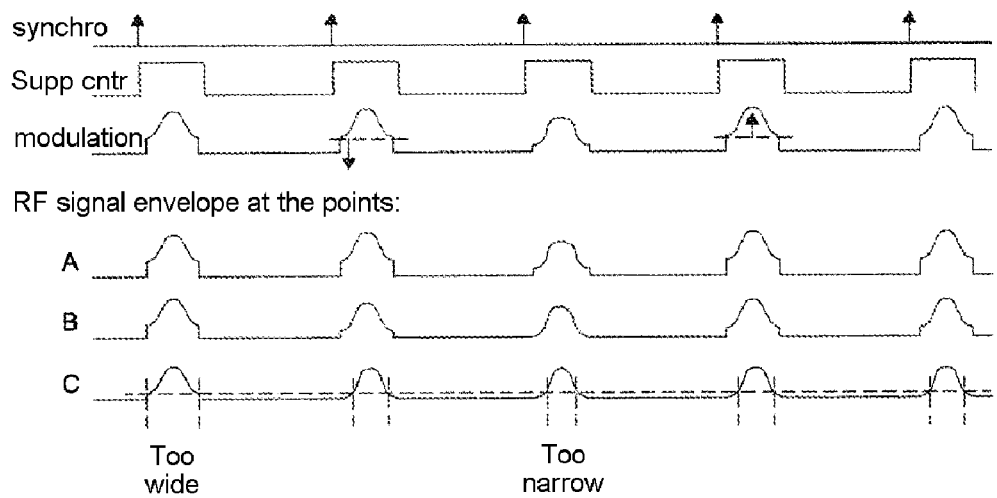

FIG. 2 represents the timecharts of the synchro transmission control received by the digital processing device, of the pulsed power supply control of the amplifier 1, of the modulation generated by the system according to the invention and applied to the input of the amplifying chain at the level of the first amplifier.

On part 2A, the signals are represented with the control for the power. The synchronization signal, the power supply control signal, and the envelope have been described at the points A, B and C of FIG. 1.

On part 2B, the signals are represented with the control of the width. In the same manner, the synchronization and power supply control signals and the modulation signal are represented. The figure also represents the envelope of the RF signals at the points A, B and C of FIG. 1.

Figure 3:
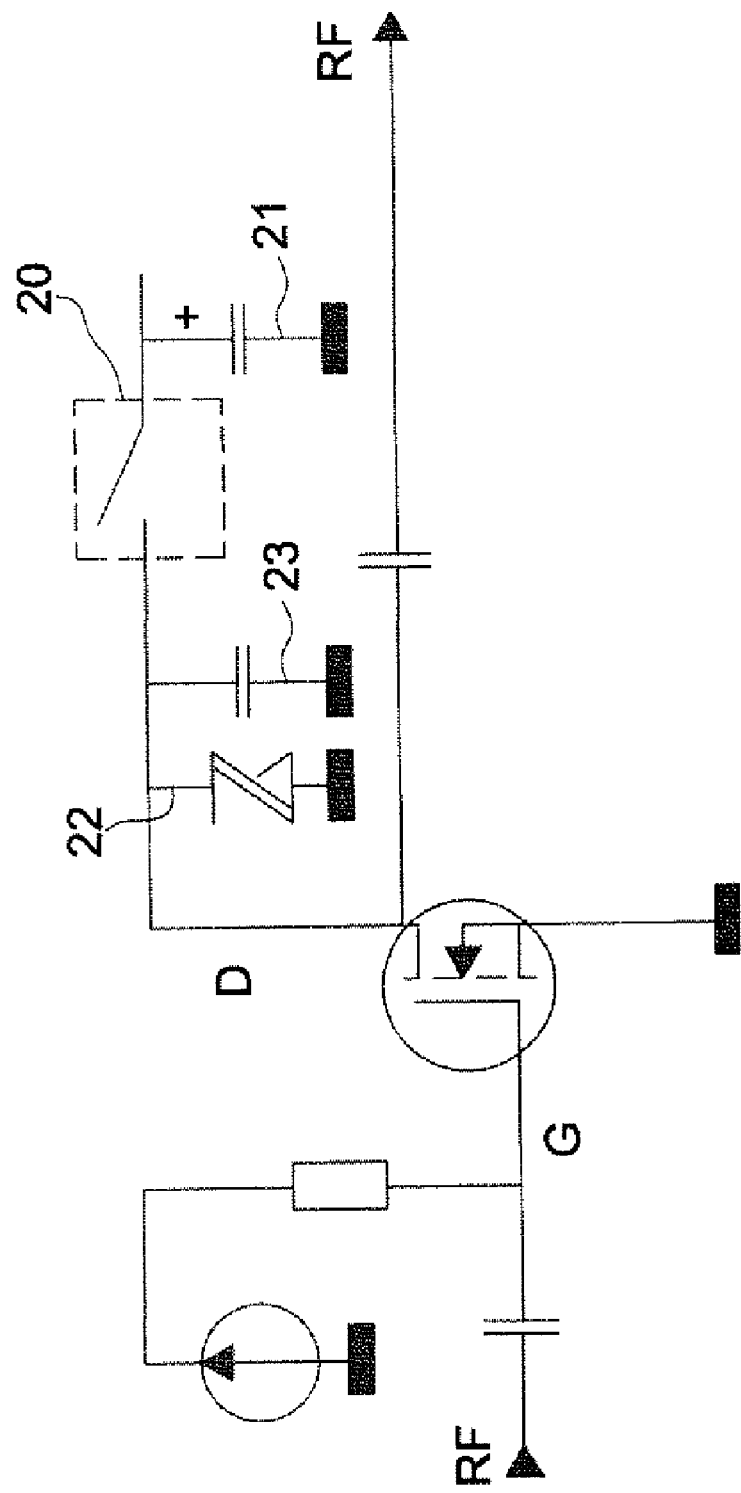

FIG. 3 represents an LDMOS transistor operating in the RF power amplification pulsed regime.

The gate G of the transistor receives the frequency-modulated signal and is powered by a gate power supply. The drain D is linked to a DC power supply by means of a low-loss switch 20. The switch 20 is controlled by means of the signal sync for synchronizing transmission of the modulated signal. The drain current is present only when the drain is powered. A fast bi-directional voltage clipping device, 22, value lying between the peak power supply of the drain and the drain source breakdown voltage of the LDMOS transistor, offers effective protection against the overvoltages inherent in operation of this type. The capacitor 23 allows RF radiofrequency decoupling.

The necessary instantaneous energy is provided by a reservoir capacitor 21 of high value calculated as a function of the load rate of the transmitter and low resistance in series. This technological choice makes it possible notably to minimize losses.

The low-loss switch is made for example using MOSPOWER transistors. It is therefore easy to make and offers all the qualities of withstanding high peak drain current and of low losses.

The power supply VG of the gate can be:
  a gain-control variable DC voltage, for example a variable-gain ampli,
  a modulation signal for a stage used as a modulator,
  the gate voltage can be amplitude-controlled, adjustment of the quiescent drain current, adjustment of the RF gain of the stage.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. A device for generating a modulation signal for an RF pulse transmitter comprising at least one amplifier, the device comprising:
  a detector coupled to an output of the at least one amplifier;
  a video amplifier coupled to an output of the detector;
  an analog processing device coupled to the video amplifier and configured to generate at least one information cue based on an output signal from the video amplifier; and
  a modulation signal generating device configured to receive the information cue from the analog processing device and to output the modulation signal to the RF pulse transmitter, the modulation signal generating device comprising:
    a digital processing device configured to receive a transmission synchro signal and the information cue and to generate a first control signal and a second control signal; and
    a signal generating device configured to generate a variable-amplitude Gaussian-shaped signal in response to the first control signal, to generate a variable-amplitude square-shaped signal in response to the second control signal, and to generate the modulation signal according to the Gaussian-shaped signal and the square-shaped signal, wherein the signal generating device comprises an analog switch and a digital potentiometer arranged for generating the square-shaped signal.

2. The device as claimed in claim 1, wherein the signal generating device comprises a digital-to-analog converter (DAC) and a digital potentiometer arranged for generating the Gaussian-shaped signal.

3. A device for generating a modulation signal for an RF pulse transmitter comprising at least one amplifier, the device comprising:

- a detector coupled to an output of the at least one amplifier;
- a video amplifier coupled to an output of the detector;
- an analog processing device coupled to the video amplifier and configured to generate at least one information cue based on an output signal from the video amplifier; and
- a modulation signal generating device configured to receive the information cue from the analog processing device and to output the modulation signal to the RF pulse transmitter, the modulation signal generating device comprising:
  - a digital processing device configured to receive a transmission synchro signal and the information cue and to generate a first control signal and a second control signal; and
  - a signal generating device configured to generate a variable-amplitude Gaussian-shaped signal in response to the first control signal, to generate a variable-amplitude square-shaped signal in response to the second control signal, and to generate the modulation signal according to the Gaussian-shaped signal and the square-shaped signal,
- wherein the video amplifier is coupled between the output of the at least one amplifier of the RF pulse transmitter and a circulator of the RF pulse transmitter.

4. The device as claimed in claim 3, wherein the signal generating device comprises a digital-to-analog converter (DAC) and a digital potentiometer arranged for generating the Gaussian-shaped signal.

5. A device for generating a modulation signal for an RF pulse transmitter comprising at least one amplifier, the device comprising:

- a detector coupled to an output of the at least one amplifier;
- a video amplifier coupled to an output of the detector;
- an analog processing device coupled to the video amplifier and configured to generate at least one information cue based on an output signal from the video amplifier; and
- a modulation signal generating device configured to receive the information cue from the analog processing device and to output the modulation signal to the RF pulse transmitter, the modulation signal generating device comprising:
  - a digital processing device configured to receive a transmission synchro signal and the information cue and to generate a first control signal and a second control signal; and
  - a signal generating device configured to generate a variable-amplitude Gaussian-shaped signal in response to the first control signal, to generate a variable-amplitude square-shaped signal in response to the second control signal, and to generate the modulation signal according to the Gaussian-shaped signal and the square-shaped signal,
- wherein the modulation signal generating device is configured to output the modulation signal to another amplifier of the RF pulse transmitter, and the digital processing device is configured to output a third control signal to a pulsed-voltage power supply of the RF pulse transmitter, the pulsed-voltage power supply powers the another amplifier of the RF pulse transmitter.

6. The device as claimed in claim 5, wherein the signal generating device comprises a digital-to-analog converter (DAC) and a digital potentiometer arranged for generating the Gaussian-shaped signal.

* * * * *